United States Patent [19]

Saari

[11] 4,240,040
[45] Dec. 16, 1980

[54] OPERATIONAL AMPLIFIER

[75] Inventor: Veikko R. Saari, Spring Lake Heights, N.J.

[73] Assignee: Bell Telephone Laboratories, Incorporated, Murray Hill, N.J.

[21] Appl. No.: 441,352

[22] Filed: Feb. 11, 1974

[51] Int. Cl.[2] .............................................. H03F 3/26
[52] U.S. Cl. .................................... 330/255; 330/261; 330/267
[58] Field of Search ..................... 330/15, 17, 20, 22, 330/30 D, 40, 69, 9

[56] References Cited

U.S. PATENT DOCUMENTS

| | | | |
|---|---|---|---|
| 3,077,566 | 2/1963 | Vosteen | 330/9 X |
| 3,569,849 | 3/1971 | Cassidy | 330/30 D X |

*Primary Examiner*—James B. Mullins
*Attorney, Agent, or Firm*—Henry T. Brendzel; Gerard F. Murphy

[57] ABSTRACT

An internally compensated monolithic integrated operational amplifier circuit has a differential input stage, balanced complementary common base stage, a complementary compound emitter-follower stage, and a push-pull output stage. The push-pull output stage includes complementary common emitter transistors, the base electrode of each transistor connected to a transistor connected in common base configuration. Bandwidth and slew rate are enhanced by a feed-forward capacitor connected between the amplifier inverting input and the input to the push-pull output stage and also by a range extender network connected between the output of the input differential stage and the input of the push-pull output stage. Internal bias voltages are referenced to the potential applied to the amplifier noninverting input by means of a voltage follower circuit which is interactively connected with a diode chain and current sources.

25 Claims, 8 Drawing Figures

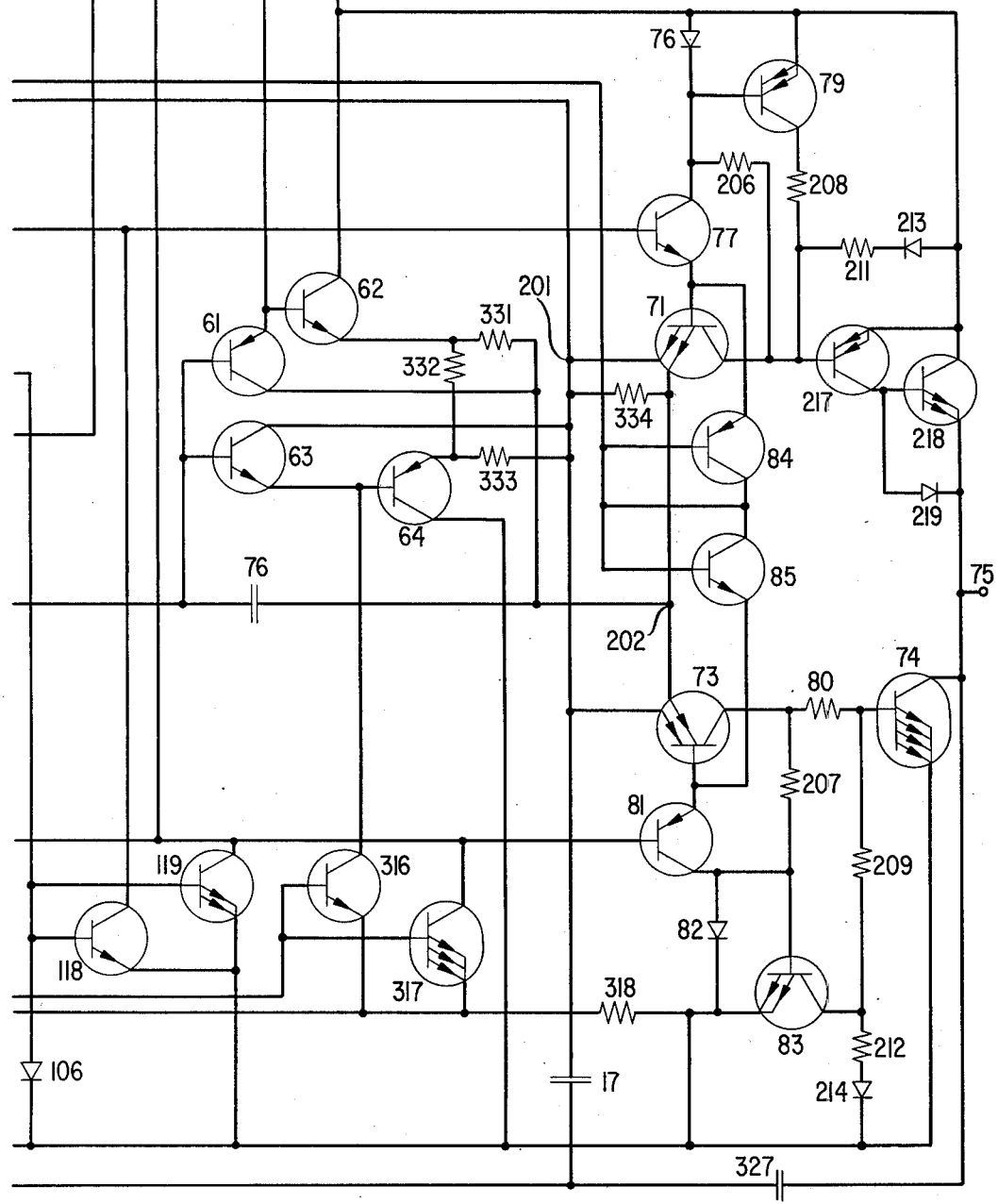

OPERATIONAL AMPLIFIER

BACKGROUND OF THE INVENTION

This invention relates to amplifiers and, more particularly, to wideband monolithic integrated circuit amplifiers exhibiting high slew rates.

There are many performance characteristics which are important to users of operational amplifier circuits. Among these are gain, input and output impedance, low power consumption, bandwidth and settling time, low noise operation, common mode rejection characteristics, and amplifier input offset characteristics. It is well known that these performance characteristics are interrelated, that is, an attempt to improve a specific characteristic usually mandates acceptance of decreased performance in some other respect. Moreover, designers of silicon integrated amplifier circuits have been further constrained by the limitations of the state of the integrated circuit processing art. These constraints have resulted in a multitude of integrated operational amplifier circuits, some of which have been designed to optimize a particular operating characteristic and some of which have been designed to provide general purpose circuits which can be used in a fairly wide range of applications. In either type of design, the prior art has generally considered that the attainment of a high common mode rejection range necessitated relatively high collector-to-base bias voltages at the amplifier input stages. The use of substantial bias voltages, however, often makes level shifting stages necessary in order to maintain reasonable bias supply voltages.

In addition, although the prior art has recognized the use of feed forward techniques to enhance bandwidth and slew rate, it has been generally considered that these techniques were only applicable to amplifiers operated solely in the inverting mode. Moreover, the difficulty in economically integrating PNP transistors which exhibit good gain characteristics, especially at high frequencies, has constrained the prior art to NPN output stages or to complementary output stages which utilize laterally diffused PNP transistors. Accordingly, in the case of complementary output stages incorporating lateral PNP transistors, prior art circuits have exhibited limited bandwidth.

It is accordingly an object of this invention to realize an integrated amplifier circuit which provides high slew rate in both the inverting and noninverting modes of operation while maintaining low quiescent power consumption, low noise operation, and relatively high output signal capabilities.

It is a further object of this invention to realize an integrated amplifier circuit which has a high common mode rejection range without the use of substantial collector-to-base bias voltages and the attendant prior art level shifting stages.

It is yet another object of this invention to utilize recent advances in the art of silicon integrated circuits to provide an amplifier with a new high-speed complementary output stage which operates a low quiescent power consumption while exhibiting excellent output voltage and current capabilities.

SUMMARY OF THE INVENTION

In accordance with the principles of this invention, the outputs of an operational amplifier differential input stage, which includes active load circuits, are connected to the inputs of a balanced complementary common base stage. The differential input stage and the common base stage structurally cooperate to establish the necessary input impedance, gain, and signal handling capability while maintaining low quiescent current and freedom from latch-up. The output of the balanced common base stage is connected to a compound emitter-follower circuit which provides current gain and acts as an impedance transformation stage. The output of the compound common emitter stage is connected to a complementary pushpull output stage, each section of which utilizes a common base transistor and a common emitter transistor. Preferably, the complementary PNP output transistor of the output stage is a vertically diffused transistor fabricated in a manner similar to that disclosed by P. C. Davis and S. F. Moyer in a paper entitled, "Ion Implanted Compatible Complementary PNPs for High Slew Rate Operational Amplifiers," which was presented at the International Electron Devices Meeting on December 4-5-6, 1972, at Washington, D.C.

A range extender circuit connected between the output of the differential input stage and the input of the output stage, thereby shunting both the balanced common base stage and the compound emitter-follower stage, provides midband signal to the output stage to enhance both midband operation and the transient or slew characteristics. A feed forward capacitor connected between the inverting input of the input differential stage and the input of the output stage, thereby shunting all stages prior to the output stage, further enhances slew rate.

In addition, the internal bias voltages are referenced or locked to the potential at the noninverting input terminal of the differential input stage. Thus, the internal bias voltages are, in effect, driven by the applied signal. This allows high common mode rejection range without necessitating high collector-to-base bias voltages and level shifting stages. This bias technique also sufficiently limits the voltage across circuit capacitances so that junction capacitors may be utilized, thereby enabling realization of the circuit in monolithic form. Further, the bias structure provides a means for ensuring that certain transistors within the amplifier do not saturate during transient signal conditions or because of component variations attributable to normal manufacturing tolerances.

BRIEF DESCRIPTION OF THE DRAWING

FIG. 1C depicts the relationship between FIGS. 1A and 1B;

FIGS. 4A and 4B are schematic illustrations of a monolithic internally compensated embodiment of the present invention; and FIG. 4C depicts the relationship between FIGS. 4A and 4B.

DETAILED DESCRIPTION OF THE DRAWING

Figure 1A:
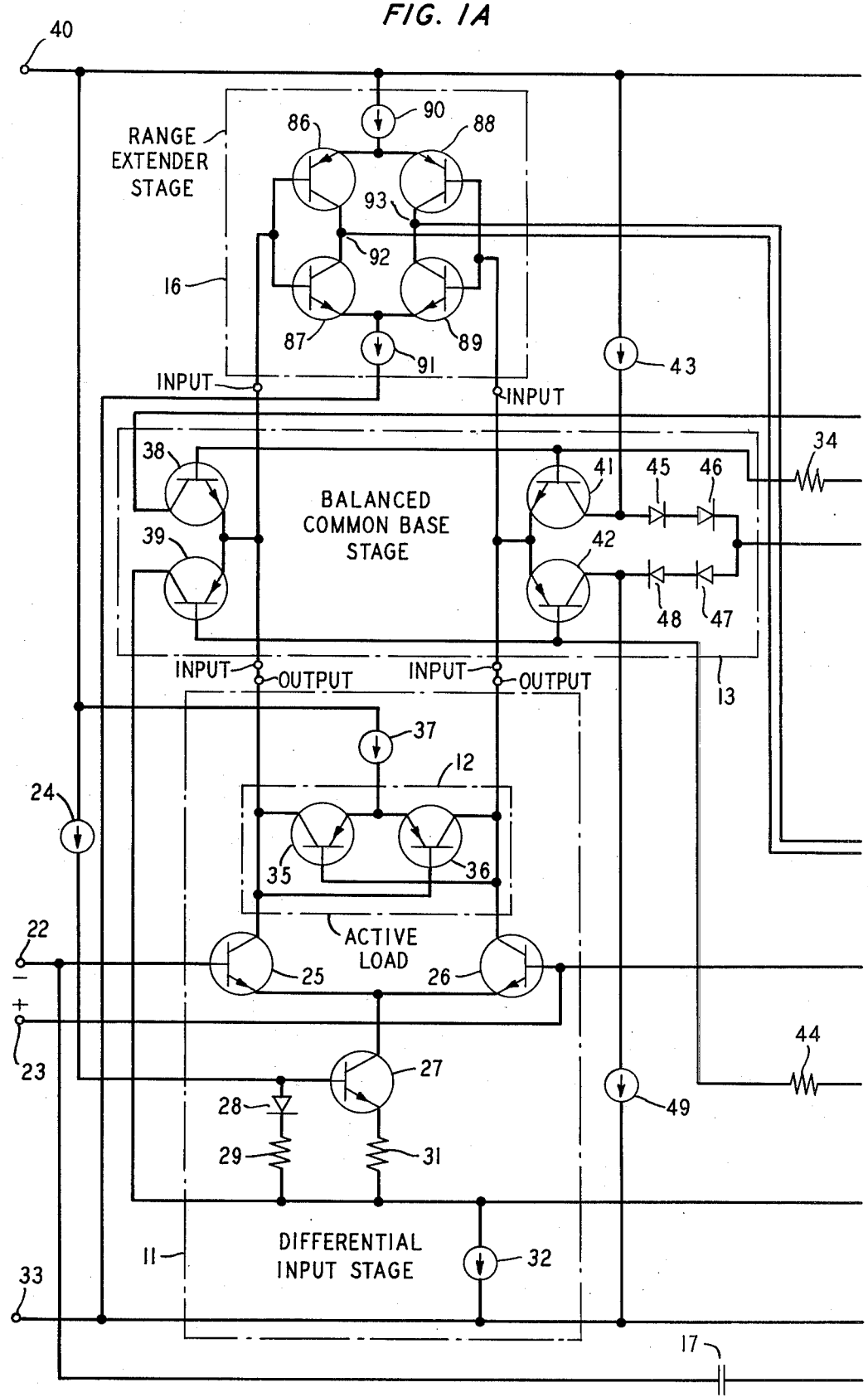
FIGS. 1A and 1B schematically depict a basic embodiment of an operational amplifier in accordance with the present invention.
Figure 1B:
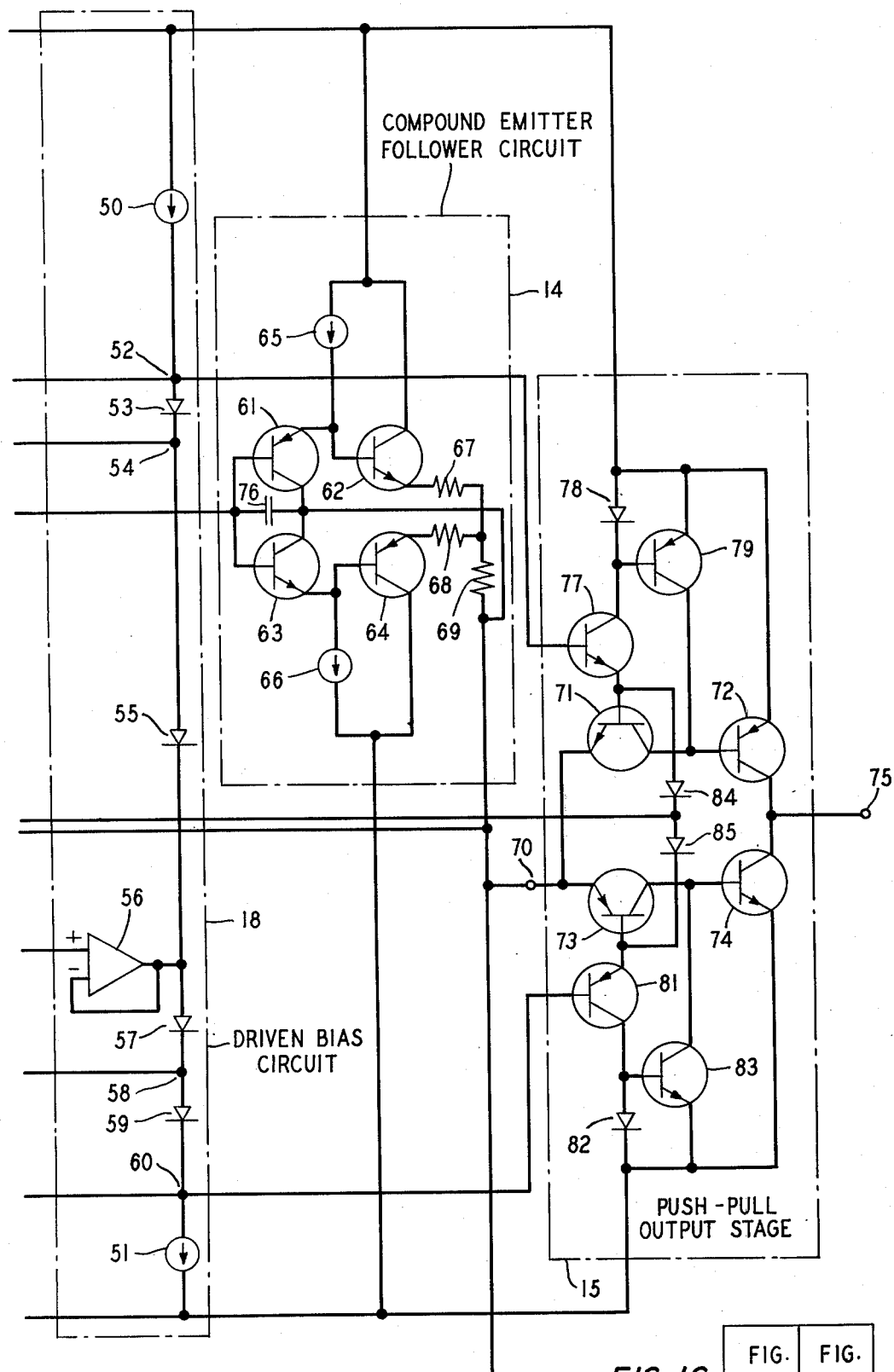

To aid in understanding the present invention, FIGS. 1A and 1B have been partitioned into sections which demonstrate the functional relationships which exist between various circuit stages. In FIG. 1A, the outputs of differential input stage 11, which includes active load circuit 12, are connected to range extender circuit 16, and common base balanced push-pull stage 13. The output of balanced common base stage 13 connects to compound emitter-follower stage 14 (FIG. 1B) which, in turn, connects to push-pull output stage 15. The outputs of range extender circuit 16 are connected to the input of output stage 15. In addition, capacitor 17 is connected between amplifier inverting input terminal 22 and the input of output stage 15. Bias voltages are applied to terminals 33 and 40.

In examining the input differential stage 11, it can be seen that the stage consists primarily of emitter coupled transistor pair 25 and 26, the base electrodes of which are respectively connected to inverting input terminal 22 and noninverting input terminal 23. The commonly connected emitters of transistors 25 and 26 are connected to the collector of transistor 27. The emitter of transistor 27 is connected through resistor 31 to circuit node 60. As will be seen, circuit node 60 provides a bias potential which is related to the signal voltage applied to noninverting input terminal 23. Bias for transistor 27 is supplied by conventional current source 24 which is connected between the base terminal of transistor 27 and bias terminal 40. Serially connected resistor 29 and diode 28 complete the bias path and are connected between the base of transistor 27 and node 60. Current source 32 is connected between circuit node 60 and bias terminal 33.

Active load circuit 12 includes a pair of differentially connected transistors 35 and 36, with the emitters of transistors 35 and 36 commonly connected, and the collectors of transistors 35 and 36 connected to the collectors of transistors 25 and 26, respectively. The base of transistor 36 is connected to the collector of transistor 25, and the base of transistor 35 is connected to the collector of transistor 26. Bias current for active load circuit 12 is supplied by current source 37 which is connected between bias terminal 40 and the commonly connected emitters of transistors 35 and 36.

In one embodiment of this invention, the bias of active load circuit 12 was established such that twice as much signal current flowed into the input circuit of common base stage 13 as that signal current which flowed into the active load input emitter circuits, thereby establishing a 6 db current gain. This current gain advantageously isolates the input differential stage 11 from subsequent stages in order to minimize both noise and input offset. It will be recognized by those skilled in the art that additional gain can be provided by including resistors (not shown) between each collector of input differential stage 11 (collectors of transistors 25 and 26) and the respective base electrode of the differential active load stage (bases of transistors 35 and 36).

Common base stage 13 is a balanced circuit comprising transistors 38, 39, 41, and 42 and diodes 45, 46, 47, and 48. The emitters of complementary transistors 38 and 39 are commonly connected to the collector of transistor 25 of input differential stage 11. The base of transistor 39 is connected to the base of transistor 42 and the commonly connected bases are connected to terminal 58 of driven bias circuit 18 by resistor 44. In a like manner, the base of transistor 38 is connected to the base of transistor 41 and the commonly connected bases are connected to terminal 54 of driven bias circuit 18 by resistor 34. The collector of transistor 39 is connected to driven bias terminal 60, and the collector of transistor 38 is connected to terminal 52 of driven bias circuit 18. The commonly connected emitters of transistors 41 and 42 are connected to the collector of transistor 26 in input differential circuit 11. The collectors of transistors 41 and 42 are connected by serially connected diodes 45, 46, 47, and 48. These diodes provide a low impedance path for coupling the signal to compound emitter follower stage 14 while insuring proper bias voltages within common base stage 13. The collector of transistor 41 is connected to constant current source 43 and the collector of transistor 42 is connected to constant current source 49.

Compound emitter-follower circuit 14 comprises complementary transistor pair 61 and 62 and complementary transistor pair 63 and 64. The base of transistor 61 is connected to the base of transistor 63 and the collector of transistor 61 is connected to the collector of transitor 63. The commonly connected base electrodes of transistors 61 and 63 serve as the input terminal of compound emitter follower stage 14, and are connected to the output terminal of common base stage 13. The commonly connected collectors of transistors 61 and 63 are connected to input terminal 70. It will be recognized that the collectors of transistors 61 and 63 could be individually connected to bias terminals 33 and 40, respectively. The common connection to input terminal 70, however, has been found advantageous in that less bias current is required. Bias for the compound emitter-follower stage is supplied by positive current source 65 which is connected between bias terminal 40 and the commonly connected emitter and base of transistor pair 61-62 and by negative current source 66 which is connected between bias terminal 33 and the commonly connected emitter and base of transistor pair 63-64. The collector of transistor 62 is connected to bias terminal 40, and the collector of transistor 64 is connected to bias terminal 33. Resistors 67 and 68 are serially connected between the emitters of transistors 62 and 64. Resistor 69 is connected between the junction of resistors 67 and 68 and input terminal 70 of push-pull output stage 15. Capacitor 76 is connected between the commonly connected collectors and the commonly connected bases of transistors 61 and 63.

Resistors 67, 68, and 69, in conjunction with capacitor 76, establish a transmission zero and thus determine the frequency response of compound emitter-follower stage 14. Resistors 67 and 68 provide resistance in series with the effective emitter resistances of transistors 62 and 64. This series resistance ensures that the transmission zero and, thus the frequency response, will not shift during high current signal conditions which effectively modulate the emitter resistances of transistors 62 and 64. It should be realized that various resistive networks or other suitable electrical networks which provide the necessary isolation and resistance in series with the emitters of transistors 62 and 64 may be used. For example, a second resistive network is disclosed in FIG. 4, which depicts a particular monolithic embodiment of the subject operational amplifier.

Output stage 15 is a push-pull circuit combining common base connected transistors 71 and 73 with common emitter connected transistors 72 and 74. Input terminal 70 of the output stage 15 connects to the emitters of common base transistors 71 and 73. The collectors of transistors 71 and 73 are connected respectively to the base electrodes of transistors 72 and 74. Transistors 72 and 74 are complementary output transistors whose collector-to-emitter paths are serially connected between bias terminals 40 and 33. The commonly connected collector electrodes of transistors 72 and 74 are connected to amplifier output terminal 75. Each section of output stage 15 is biased by a transistor circuit which is connected to driven bias circuit 18. Transistors 71 and 72 are biased by transistors 77 and 79 and diodes 78 and 84. The emitter of transistor 77 is connected to the base of transistor 71. The base of transistor 77 is connected to terminal 52 of driven bias circuit 18. The collector of transistor 77 is commonly connected to the cathode of diode 78 and the base electrode of transistor 79. The anode of diode 78 is connected to bias terminal 40, as is the emitter of transistor 79. The collector of transistor 79 is connected to the base of transistor 72.

In the second section of the Class A-B output stage, bias is provided in a similar manner by transitors 81 and 83 in conjunction with diodes 82 and 85. The base of transistor 81 is connected to terminal 60 of driven bias circuit 18. The emitter of transistor 81 is connected to the base of transistor 73. The collector of transistor 81 is commonly connected to the anode of diode 82 and the base of transistor 83. Both the cathode of diode 82 and the emitter of transistor 83 are connected to bias terminal 33. The collector of transistor 83 is connected to the base of transistor 74.

Diodes 84 and 85 are serially connected between the bases of transistors 71 and 73. The junction of diodes 84 and 85 is connected to output terminal 93 of range extender circuit 16, whereas the output of terminal 92 of range extender circuit 16 is connected to input terminal 70 of output stage 15. Capacitor 17 is connected between inverting input terminal 22 and output stage 15 input terminal 70.

Driven bias circuit 18 includes diodes 53, 55, 57, and 59, current sources 50 and 51, and voltage follower circuit 56. The diodes and current sources are serially connected between bias terminals 33 and 40 and voltage follower 56 establishes the potential at the junction of diodes 55 and 57 at a voltage substantially identical to that voltage applied to noninverting input terminal 23. Thus, it will be seen that certain predetermined voltage relationships are established at appropriate nodes of the bias circuit. For example, node 54, which supplies bias to transistors 41 and 38 of common base stage 13, operates at a potential which is equal to the signal potential applied to noninverting input terminal 23 plus the voltage drop across diode 55. In a like manner, the voltage at node 58, which supplies bias to transistors 39 and 42 of common base stage 13, can be seen to be at a potential equal to the potential applied to noninverting input terminal 23 minus the voltage drop across diode 57. Likewise, it may be seen that the voltage at circuit node 60 is held equal to the potential applied to the noninverting input terminal 23 minus the sum of the voltage drops across diodes 57 and 59, whereas the potential at node 52 is equal to the potential applied to noninverting input terminal 23 plus the voltage drops across diodes 53 and 55.

Range extender circuit 16 is a balanced input-balanced output circuit which includes complementary transistors 86 and 87 and complementary transistors 88 and 89. The bases of transistors 86 and 87 are commonly connected to the collector of transistor 25 of input differential stage 11 and the commonly connected bases of transistors 88 and 89 are commonly connected to the collector of transistor 26 of input differential stage 11. The emitters of transistors 86 and 88 are commonly connected to current source 90, whereas the emitters of transistors 87 and 89 are connected to current source 91. The output of range extender circuit 19 is available at terminals 92 and 93. As previously explained, these outputs are applied to two different nodes of output stage 15.

Figure 4A:
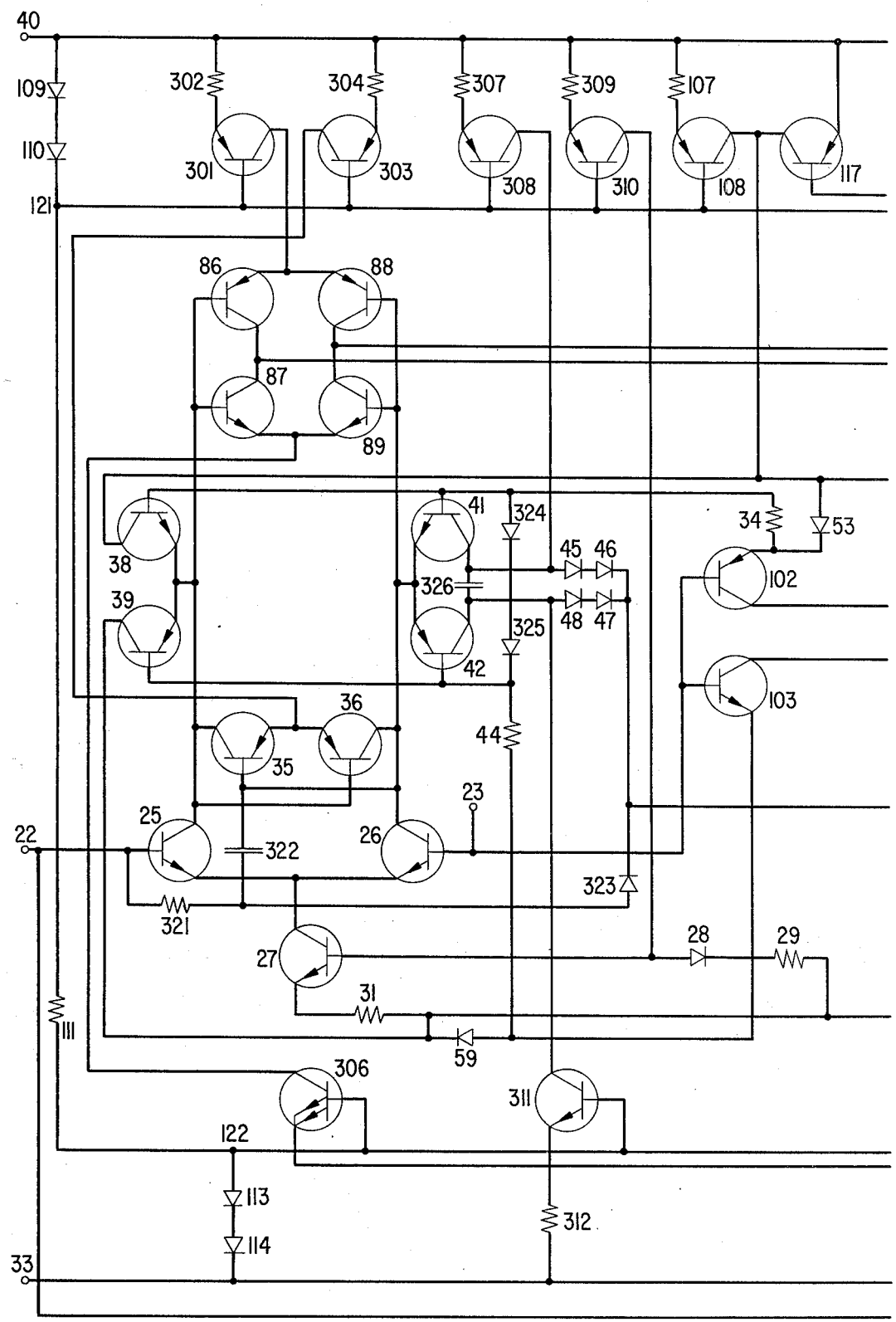

Range extender circuit 16 couples signal from the output of differential input stage 11 directly to the input of output stage 15 during transient or high slew rate operation. In the absence of range extender 16, the initial amplifier slew rate would be satisfactory, but since feed-forward capacitor 17 can only transfer a limited amount of charge between inverting input 22 and input terminal 70 of output stage 15, the slew rate would not adequately allow high slew performance with input signals having substantial transitions in signal level. It will be noted that range extender circuit 16 is especially advantageous in a monolithic amplifier embodiment such as depicted in FIGS. 4A and 4B, since feed-forward capacitor 17 must then necessarily be of a low capacitance value.

In one embodiment of applicant's invention, it was found that range extender circuit 16 improved transient performance by a factor of approximately three. That is, during an extended-range slew condition the range extender circuit provided twice the current drive to the output stage as was provided by compound emitter-follower circuit 14. It should be noted that this improvement in transient response is obtained without compounding the circuit noise output, since the small signal gain of range extender circuit 16 is much lower than the gain of common base circuit 13 and compound common emitter stage 14 which it shunts.

Figure 2:
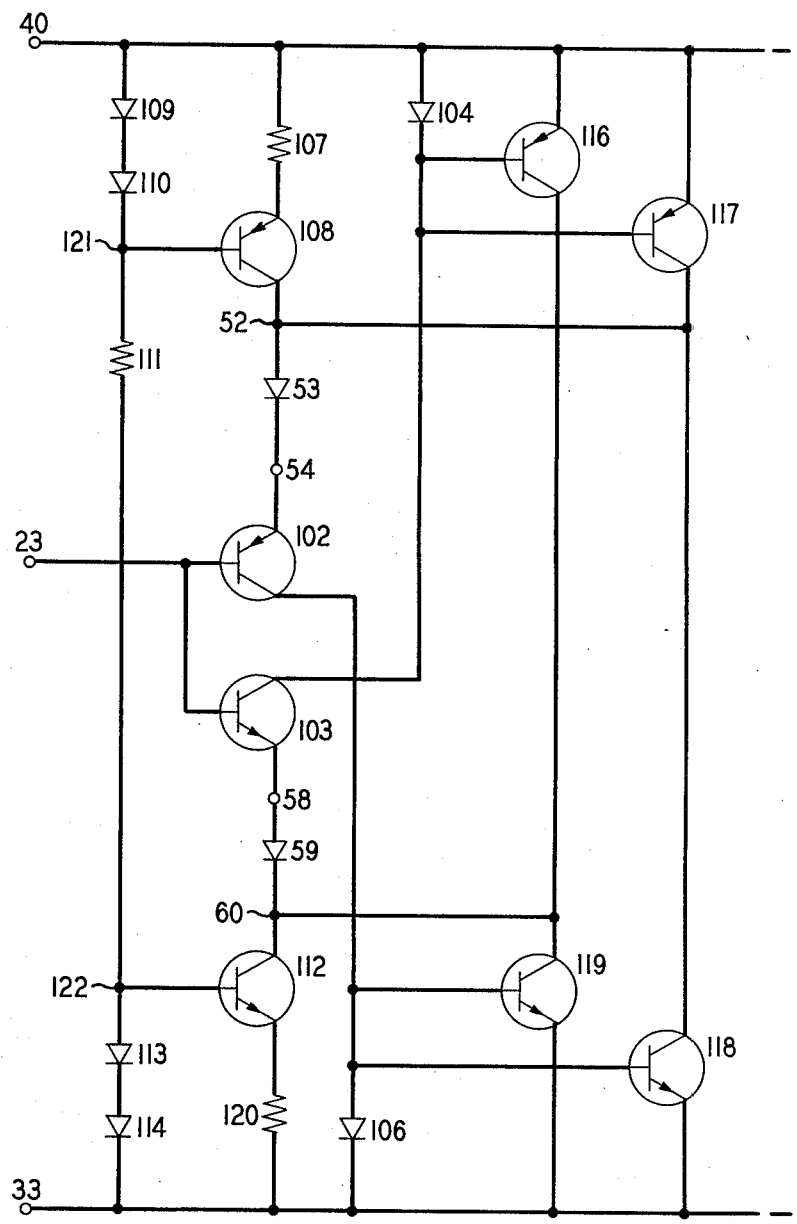
FIG. 2 is a detailed schematic illustration of one embodiment of a driven bias circuit in the practice of this invention.

FIG. 2 is a detailed schematic depiction of one embodiment of driven bias circuit 18. In FIG. 2, circuit elements which correspond to elements of FIG. 1 have been designated by the same identifiers as utilized in FIG. 1. Current sources 50 and 51 of FIG. 1 have been replaced by transistor 108 and resistor 107 and by transistor 112 and resistor 120, respectively. Bias voltages for these current sources are supplied by the series connected circuit branch comprising diodes 109, 110, 113, and 114 and resistor 111. This circuit branch is connected between bias terminals 40 and 33 with the base of transistor 108 connected to terminal 121, which is the junction of the cathode of diode 110 and resistor 111, and the base of transistor 112 connected to terminal 122, which is the junction of resistor 111 and the anode of diode 113. It will be realized that upon examining the monolithic embodiment of FIG. 4 that terminals 121 and 122 may also provide bias voltage for the current sources depicted as elements 24, 32, 37, 43, 49, 65, 66, 90, and 91 of FIG. 1.

Voltage follower 56 of FIG. 1 has been replaced by transistors 102 and 103. The base electrodes of transistors 102 and 103 are commonly connected to amplifier noninverting input terminal 23. The collector of transistor 102 is connected to bias terminal 33 by diode 106 and the collector of transistor 103 is connected to bias terminal 40 by diode 104. The emitters of transistors 102 and 103 are respectively connected to terminals 54 and 58 of the driven bias chain. In examining this configuration, it will be realized that transistors 102 and 103 function essentially as emitter-follower circuits, thereby causing the voltages at driven bias terminals 52, 54, 58, and 60 to properly follow the potential applied to noninverting input 23. In particular, it can be seen that the base-emitter junctions of transistors 102 and 103 have respectively replaced diodes 55 and 57 of FIG. 1.

Although the circuit as thus described will establish the desired driven bias potentials, additional circuitry is desirable to enable the bias chain to respond to rapidly changing potentials which may be applied to noninverting input 23, while still maintaining low quiescent currents through the chain. This, of course, prevents slew limiting without unnecessarily increasing quiescent power consumption. In the circuit of FIG. 2, interactive current sources which include transistors 116, 117, 118, and 119 provide this desirable feature. The base electrodes of transistors 118 and 119 are commonly connected to the collector of transistor 102 and the emitters of transistors 118 and 119 are connected to bias terminal 33. The collectors of transistors 118 and 119 are connected respectively to driven bias terminals 52 and 60. The base electrodes of transistors 116 and 117 are commonly connected to the collector electrode of transistor 103 and the emitter electrodes are commonly connected to bias terminal 40. The collector electrodes of transistors 116 and 117 are respectively connected to terminals 60 and 52 of the driven bias diode chain.

It will be realized that the currents supplied by transistors 117 and 118 are respectively controlled by the collector currents of transistors 103 and 102. Since the collector electrodes of transistors 117 and 118 are commonly connected to node 52 of the diode chain, transistors 117 and 118 determine the quiescent current through that portion of the diode chain comprising diode 53 and transistor 102. In a like manner, transistors 116 and 119 are responsive to the collector currents of transistors 103 and 102, respectively. Since the collector electrodes of transistors 116 and 119 are commonly connected to node 60 of the diode chain, these transistors establish the quiescent current through that portion of the diode chain comprising diode 59 and transistor 103.

It will be further realized that if, during operation in the noninverting mode, the magnitude of the applied signal causes either transistor 102 or 103 to enter the cut-off region, the current supplied by transistor 117 or 119 will respectively increase, thereby ensuring that the driver potentials of the diode chain maintain the proper voltage relationship with respect to the signal applied to noninverting input 23. Thus, it can be recognized that transistors 116, 117, 118, and 119 establish the current to the diode chain in a manner consistent with low quiescent power dissipation, while achieving high slew rate not only in the inverting mode, but also in the noninverting mode of operation.

Figure 3:
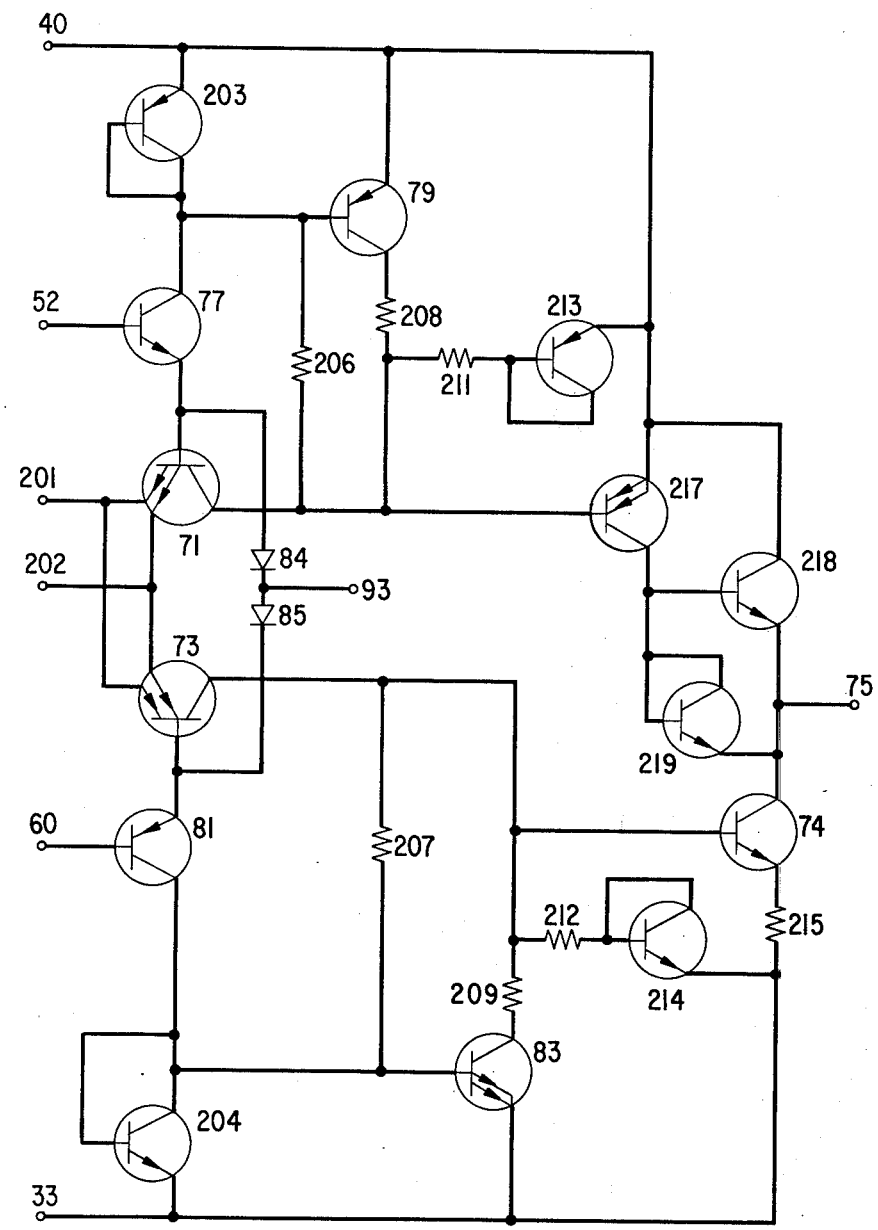
FIG. 3 schematically depicts a detailed embodiment of a push-pulll complementary output stage used in the practice of this invention.

FIG. 3 is a detailed schematic of push-pull output stage 15. For convenience, those elements of FIG. 3 which are identical to elements of FIG. 1 are denoted by the identifiers used in FIG. 1. Basically, the circuit of FIG. 3 differs from output stage 15 of FIG. 1 in that additional bias circuitry has been added to ensure bias conditions which result in low quiescent power dissipation and also in low signal distortion during output signal crossover. It will be noted that diodes 78 and 82 of FIG. 1 have been replaced with diode-connected transistors 203 and 204, respectively. In the circuit of FIG. 3, transistors 71 and 73 have two emitter diffusions which connect respectively to additional input terminals 201 and 202. It will be understood upon examining the monolithic circuit embodiment of FIG. 4 that these separate input terminals permit the output stage to be responsive to the output signals of range extender circuit 16, feed-forward capacitor 17, and the output of compound emitter-follower circuit 14 while simultaneously isolating each of these signal sources from one another.

Transistor 72 of FIG. 1 has been replaced by transistors 217 and 218 and diode-connected transistor 219. The collector of transistor 218 is connected to the emitter of transistor 217 and the base of transistor 218 is connected to the collector of transistor 217. Diode-connected transistor 219 is connected between the base and emitter electrodes of transistor 218. It will be recognized by those skilled in the art that transistor 218 and diode-connected transistor 219 form a current doubler network which effectively doubles the $\beta$ of transistor 217. Moreover, this network advantageously increases the cutoff frequency, or $f_T$, of transistor 217 by up to a factor of two as long as the $f_T$ of transistor 218 exceeds that of transistor 219. Although a need for current doubling or the exact multiplicative factor realized is dependent upon the characteristics of the PNP transistor structure, typical integrated PNP transistors do not exhibit the gain and cutoff frequency characteristics of integrated NPN devices. Thus additional gain such as is produced by transistors 217 and 218 can be advantageously used to equalize the DC gain and the rise time of the complementary output devices.

Resistors 206 and 211, in conjunction with diode-connected transistor 213, regulate the bias current through transistor 217. Resistor 206 is connected between the base of transistor 79 and the collector of transistor 71. Diode-connected transistor 213 and resistor 211 are serially connected between the emitter and base electrodes of transistor 217. This circuit establishes a quiescent emitter current in transistor 217 approximately equal to the current flowing through diode-connected transistor 203. It will be noted that the terminal of resistor 206 which connects to the base of transistor 79 is at a potential equal to the voltage applied to bias terminal 40 minus the base-emitter voltage drop of transistor 79. Similarly, the potential at the other terminal of resistor 206 is equal to the bias voltage applied to terminal 40 minus the base-emitter voltage drop of transistor 217. Thus, if the base-emitter voltage drops of transistors 79 and 217 are equal, no current flows through resistor 206. If this balanced condition is upset, current will flow through resistor 206, with a resulting change in the current flow through transistor 79. This current flow affects the base current of transistor 217 in a manner which restores the circuit to a balanced condition. Thus, in fact, a negative feedback path exists which stabilizes the output stage crossover current.

Resistor 211 and diode-connected transistor 213 provide further control over the cross-over current. When the output voltage at terminal 74 is near zero, that is, near cross-over, very little current flows through diode-connected transistor 213 and resistor 211. This small current flow, however, is sufficient to reduce the base current of transistor 217, thus aiding in stabilizing the quiescent current through transistor 217. During periods in which the potential at output terminal 75 is significantly greater than zero, the current flow through resistor 211 and diode-connected transistor 213 has far less effect on the current flow through transistor 217 and thus very little effect on circuit operation.

Resistor 208 is connected between the collector of transistor 79 and the base of transistor 217. This resistor effectively masks or overrides the parasitic capacitance of transistor 79.

Bias for the section of output stage 15, which contains transistor 74, includes resistor 207 connected between the base of transistor 74 and the base of transistor 83, resistor 209 which is connected between the collectors of transistors 73 and 83, and also include series-connected resistor 212 and diode-connected transistor 214 which are connected between the base and the emitter of transistor 74. This circuit is effectively a complementary version of the previously explained bias circuit for biasing transistor 217 and operates in essentially the same manner.

FIGS. 4A and 4B schematically depict a monolithic internally compensated embodiment of the subject invention. It will be noted that the several current sources of FIG. 1 have been replaced by transistor-resistor combinations in FIG. 4. Specifically, current source 90 has been replaced by transistor 301 and resistor 302. Current source 37 has been replaced by transistor 303 and resistor 304. Current source 43 has been replaced by transistor 308 and associated resistor 307. Current source 24 has been replaced by transistor 310 and resistor 309. Current source 65 has been replaced by transistor 314 and resistor 313. Current source 49 has been replaced by transistor 311 and resistor 312. Current sources 91 and 66 have been replaced, respectively, by transistors 306 and 316 which utilize a common emitter-resistor 318. Current sources 32 and 51 have been replaced by a single transistor 317. As was pointed out in the discussion of FIG. 2, each of these current sources utilizes the bias potentials of terminals 121 and 122.

Serially-connected resistor 321 and capacitor 322 are connected between the base of transistor 25 and the collector of transistor 26. These components have been added to enhance the signal coupled to the input of common base stage 13, particularly during transient signal operation. Serially-connected diodes 324 and 325 are connected between the base electrodes of transistors 41 and 42 in order to maintain a low dynamic impedance at the base electrodes of transistors 38, 39, 41, and 42 while simultaneously controlling the quiescent current in each of these transistors. Capacitor 326 bypasses serially-connected diodes 45, 46, 47, and 48 and passes signal transients that may momentarily exceed the diode bias current. Diode 323 is connected between the junction of resistor 321 and capacitor 322 and the junction of diodes 46 and 47. This diode which could alternately be connected between inverting input terminal 22 and the junction of diodes 46 and 47, prevents the amplifier from entering a latch-up condition. Capacitor 327 is connected between amplifier output terminal 75 and inverting input terminal 22 and provides adequate negative feedback to increase the amplifier phase margin and ensure stability.

Resistors 331, 332, 333, and 334 provide a coupling harness or resistive network between compound emitter-follower circuit 14 and the inputs to push-pull output stage 15. This network replaces resistors 67, 68, and 69 of FIG. 1 and provides superior performance when the push-pull output stage of FIG. 3 is employed. Specifically, resistor 332 is connected between the emitter electrodes of transistors 62 and 64. Resistor 331 is connected between the emitter of transistor 62 and input terminal 202 of the output stage, and resistor 333 is connected between the emitter of transistor 64 and input terminal 201 of the output stage. Resistor 334 is connected between input terminals 201 and 202 of the output stage. This resistor configuration has been found to be very advantageous, providing adequate isolation of capacitor 17 from capacitor 76 to prevent undesired feedback and also providing adequate isolation between the emitter circuits of transistors 76 and 64 and capacitor 76 to allow frequency shaping with capacitor 76 realized as a junction capacitor.

What is claimed is:

1. An operational amplifier having a noninverting input terminal, an inverting input terminal, and an output terminal comprising:

a differential input stage having first and second input terminals and first and second output terminals, said first and second input terminals of said differential stage respectively connected to said inverting and noninverting input terminals;

a balanced common base stage having first and second input terminals and an output terminal, said first and second input terminals respectively connected to said first and second output terminals of said differential input stage;

an output stage having an input terminal and an output terminal, said input terminal connected to said output terminal of said balanced common base stage and said output terminal connected to said operational amplifier output terminal; and driven bias means responsive to the signal applied to said noninverting input terminal for supplying bias voltages to said differential input stage, said balanced common base stage, and said output stage, each of said driven bias voltages being related to said signal applied to said noninverting input terminal by a predetermined voltage differential.

2. The operational amplifier circuit of claim 1 further including circuit means connected between said first and second output terminals of said differential input stage and said input terminal of said output stage for extending the slewing range of said operational amplifier.

3. The operational amplifier circuit of claim 1 further including a feed-forward capacitor connected between said inverting input terminal and said input terminal of said output stage.

4. The operational amplifier circuit of claim 1 wherein said driven bias means includes a circuit branch comprising a plurality of series connected diodes, means for establishing a predetermined quiescent current through each of said diodes, and voltage follower means connected between said noninverting input terminal and said circuit branch for establishing said predetermined voltage differential between said driven bias voltages and said potential at said noninverting input terminal.

5. The operational amplifier circuit of claim 4 further including controlled current means responsive to the signal applied to said noninverting input terminal for supplying additional current to said circuit branch during rapid transistions in said signal applied to said noninverting input terminal.

6. The operational amplifier circuit of claim 1 wherein said output stage is a complementary push-pull stage including first and second npn transistors and first and second pnp transistors, the collector terminals of said first npn and first pnp transistor commonly connected to said amplifier output terminal, the emitter of said first pnp transistor connected to a first terminal of fixed potential, the emitter of said first npn transistor connected to a second terminal of fixed potential, the base of said first pnp transistor connected to the collector of said second npn transistor, the base of said first npn transistor connected to the collector of said second pnp transistor, and the emitters of said second pnp transistor and said second npn transistor commonly connected to said input terminal of said output stage;

said output stage further including means for supplying a first one of said driven bias voltages to said base of said second npn transistor, means for supplying a second one of said driven bias voltages to the base of said second pnp transistor, and first and second current supply means respectively responsive to said first and second driven bias voltages for establishing the bias current in said first pnp transistor and said first npn transistor respectively.

7. An operational amplifier having a noninverting input terminal, an inverting input terminal, and an output terminal comprising:
a differential input stage having first and second input terminals and first and second output terminals, said first and second input terminals of said differential stage respectively connected to said inverting and noninverting input terminals;
a balanced common base stage having first and second input terminals and an output terminal, said first and second input terminals respectively connected to said first and second output terminals of said differential input stage;
an output stage having at least one input terminal and an output terminal;
a compound emitter follower stage connected between said output terminal of said balanced common base stage and said input terminal of said output stage; and
a driven bias stage connected to said noninverting input terminal for supplying bias potentials to said differential input stage, said balanced common base stage, and said output stage, each of said supplied bias potentials related to the signal potential applied to said noninverting input terminal by a predetermined voltage differential.

8. The operational amplifier circuit of claim 7 wherein said driven bias stage includes a diode chain comprising a plurality of series connected diodes, at least one current source connected in series with said diode chain, and voltage follower means connected between said noninverting input terminal and a circuit node of said diode chain for establishing said bias voltages.

9. The operational amplifier of claim 7 wherein said driven bias stage includes:
a first and second transistor, a first and second current source, and a first and second diode, the base electrodes of said first and second transistors commonly connected to said noninverting input terminal, the collectors of said first and second transistors connected to first and second bias terminals, respectively, the emitter of said first transistor connected to the anode of said first diode, said first current source connected between said second bias terminal and the cathode of said first diode, the emitter of said second transistor connected to the cathode of said second diode and said second current source connected between said first bias terminal and the anode of said second diode;

third and fourth current sources, said third current source connected between said anode of said second diode and said second bias terminal, said fourth current source connected between said cathode of said first diode and said second bias terminal, each of said third and fourth current sources responsive to the current flowing through the collector electrode of said second transistor; and
fifth and sixth current sources, said fifth current source connected between said first bias terminal and said cathode of said first diode, said sixth current source connected between said anode of said second diode and said first bias terminal, each of said fifth and sixth current sources responsive to the current flowing through the collector electrode of said first transistor.

10. The operational amplifier of claim 9 further including third, fourth, fifth, and sixth transistors and seventh and eighth current sources, the emitters of said third and fifth transistors commonly connected to said seventh current source, the emitters of said fourth and sixth transistors commonly connected to said eighth current source, the bases of said third and fourth transistors commonly connected to said first output terminal of said differential input stage, the bases of said fifth and sixth transistors commonly connected to said second output terminal of said differential input stage, the collectors of said third and fourth transistors commonly connected to a first input terminal of said output stage, and the collectors of said fifth and sixth transistors commonly connected to a second input terminal of said output stage.

11. The operational amplifier of claim 10 wherein said balanced common base stage includes seventh, eighth, ninth, and tenth transistors and third, fourth, fifth and sixth diodes, the emitters of said seventh and eighth transistors commonly connected to said first output terminal of said differential input stage, the emitters of said ninth and tenth transistors commonly connected to said second output terminal of said differential input stage, the collector of said seventh transistor connected to the anode of said second diode of said driven bias stage, said collector of said eighth transistor connected to the cathode of said first diode of said driven bias stage, said third, fourth, fifth and sixth diodes serially connected between the collectors of said ninth and tenth transistors, the junction of said fourth and fifth diodes connected to an input terminal of said compound emitter follower stage, the base terminals of said seventh and ninth transistors commonly connected to the cathode of said second diode of said driven bias stage, and the base terminals of said eighth and tenth transistors commonly connected to the anode of said first diode of said driven bias stage.

12. A complementary push-pull circuit having an input terminal and an output terminal comprising;
first and second transistors, said first and second transistors connected in common base configuration, the emitters of said first and second transistors commonly connected to said input terminal, the base electrodes of said first and second transistors respectively connected to first and second reference terminals;
third and fourth transistors, connected in common emitter configuration, the emitter of said third transistor connected to a first bias terminal, the base of said third transistor connected to the collector of said first transistor, the collector of said third transistor connected to the collector of said fourth transistor, the emitter of said fourth transistor connected to a second bias terminal, and the base of said fourth transistor connected to the collector of said second transistor;

a first current source responsive to the potential at said first reference terminal for establishing a quiescent current in the collector-emitter circuit of said third transistor; and a second current source responsive to the potential at said second reference terminal for establishing a quiescent current in the collector-emitter circuit of said fourth transistor.

13. A push-pull stage having an input terminal and an output terminal comprising:

first and second transistors, the collectors of said first and second transistors commonly connected to said output terminal and the emitters of said first and second transistors respectively connected to a first and second terminal of fixed potential;

third and fourth transistors, the emitters of said third and fourth transistors commonly connected to said input terminal and the collectors of said third and fourth transistors respectively connected to the base of said first and second transistors;

a fifth transistor, the emitter of said fifth transistor connected to the base of said third transistor, the collector of said fifth transistor connected to the cathode of a first diode; the anode of said first diode connected to said first terminal of fixed potential and the base of said fifth transistor connected to a first reference terminal;

a sixth transistor, the base of said sixth transistor connected to the collector of said fifth transistor, the emitter of said sixth transistor connected to said first terminal of fixed potential and the collector of said sixth transistor connected to the collector of said third transistor;

a seventh transistor, the emitter of said seventh transistor connected to the base of said fourth transistor, the collector of said seventh transistor connected to the anode of a second diode, the cathode of said second diode connected to said second terminal of fixed potential, and the base of said seventh transistor connected to a second reference terminal;

an eighth transistor, the base of said eighth transistor connected to the collector of said seventh transistor, the emitter of said eighth transistor connected to said second terminal of fixed potential and the collector of said eighth transistor connected to the collector of said fourth transistor; and third and fourth diodes serially connected between said bases of said third and fourth transistors.

14. The push-pull stage of claim 13 wherein said collector of said sixth transistor is connected to said collector of said third transistor by a first resistor and said collector of said eighth transistor is connected to said collector of said fourth transistor by a second resistor, said output stage further including:

a third resistor and a fifth diode serially connected between said base of said first transistor and said first terminal of fixed potential;

a fourth resistor and a sixth diode serially connected between base of said second transistor and the said second terminal of fixed potential;

a fifth resistor connected between said base of said sixth transistor and said collector of said third transistor; and a sixth resistor connected between said base of said eighth transistor and said collector of said fourth transistor.

15. The push-pull stage of claim 14 wherein said first transistor is a vertically diffused pnp transistor, said second, third, fifth, and eighth transistors are npn transistors and said fourth, sixth, and seventh are pnp transistors.

16. In an operational amplifier circuit of the type including an output terminal, an inverting input terminal, a noninverting input terminal, a differential input stage; a common base stage connected to the output terminals of said differential input stage, and a push-pull output stage, the improvement comprising:

driven bias means, responsive to the signal applied to said noninverting input terminal for controlling the bias voltage applied to said differential input stage, said common base stage and said output stage, each of said controlled bias voltages related to said signal at said noninverting input terminal by a predetermined voltage differential.

17. In an operational amplifier circuit having a differential input stage, a common base stage connected to the output terminals of said input stage, and an output stage connected to the output terminals of said common base stage, said differential input stage including an inverting input terminal and a noninverting input terminal, the improvement comprising:

driven bias means for supplying bias voltages to said input stage, said common base stage and said output stage in response to the signal applied to said noninverting input terminal of said differential input stage, said driven bias means including a plurality of serially connected diodes, means for establishing a quiescent current in said serially connected diodes, and voltage follower means connected between said noninverting input terminal of said differential input stage and a circuit node of said serially connected diodes.

18. In an operational amplifier having a noninverting input terminal, an inverting input terminal, first and second bias terminals, a differential input stage, and a balanced common base stage, the first and second input terminals of said differential input stage connected to said inverting and noninverting input terminals, respectively, and the first and second input terminals of said balanced common base stage connected to the output terminals of said differential input stage, the improvement comprising:

a first circuit branch connected between said first bias terminal and a reference node, said first circuit branch including a first current source serially connected with a first plurality of serially connected diodes;

a second circuit branch connected between said reference node and said second bias terminal, said second circuit branch including a second current source serially connected with a second plurality of serially connected diodes;

voltage follower means connected between said noninverting input terminal and said reference node, said voltage follower means maintaining the potential at said reference node within a predetermined potential of the signal applied to said noninverting input terminal; and means for selectively connecting the circuit junctures of said first and second plurality of diodes to the collector and base electrodes of said balanced common base stage to establish bias potentials for said common base stage which are driven in response to said signal applied to said noninverting input terminal.

19. In an operational amplifier having a noninverting input terminal, an inverting input terminal, first and second bias terminals, a differential input stage, and a balanced common base stage including a pair of PNP transistors and a pair of NPN transistors, the first and second input terminals of said differential input stage connected to said inverting and noninverting input terminals, respectively, the first and second input terminals of said balanced common base stage connected to the output terminals of said differential input stage, the improvement comprising:

a first and second transistor, a first and second current source, and a first and second diode, the base electrodes of said first and second transistors commonly connected to said noninverting input terminal, the collectors of said first and second transistors respectively connected to said first and second bias terminals, the emitter of said first transistor connected to the anode of said first diode, said first current source connected between said second bias terminal and the cathode of said first diode, the emitter of said second transistor connected to the cathode of said second diode and said second current source connected between said first bias terminal and the anode of said second diode, said anode of said first diode connected to said common base stage PNP transistor pair base electrodes, said cathode of said second diode connected to said common base stage NPN transistor pair base electrodes, said cathode of said first diode connected to the collector electrode of a first transistor of said PNP transistor pair, and said anode of said second diode connected to the collector electrode of a first transistor of said NPN transistor pair;

third and fourth current sources, said third current source connected between said anode of said second diode and said second bias terminal, said fourth current source connected between said cathode of said first diode and said second bias terminal, each of said third and fourth current sources responsive to the current flowing through the collector electrode of said second transistor; and fifth and sixth current sources, said fifth current source connected between said first bias terminal and said cathode of said first diode, said sixth current source connected between said anode of said second diode and said first bias terminal, each of said fifth and sixth current sources responsive to the current flowing through the collector electrode of said first transistor.

20. The operational amplifier of claim 11 wherein said output stage includes an eleventh and twelfth transistor, the emitter of said eleventh transistor and the collector of said twelfth transistor commonly connected to said operational amplifier output terminal, the collector of said eleventh transistor connected to said first bias terminal, the emitter of said twelfth transistor connected to said second bias terminal, a thirteenth transistor, the emitter and collector respectively connected to the collector and base of said eleventh transistor, a fourteenth transistor having two emitter electrodes, the collector of said fourteenth transistor connected to the base of said thirteenth transistor, the first of said emitters connected to said commonly connected collectors of said third and fourth transistors, a first capacitor connected between the junction of said fourth and fifth diodes and the second emitter of said fourteenth transistor, a fifteenth transistor having two emitter electrodes, the collector of said fifteenth transistor connected to the base of said twelfth transistor, the first and second emitters of said fifteenth transistor connected respectively to said first and second emitters of said fourteenth transistor, seventh and eighth diodes serially connected between the base electrodes of said fourteenth and fifteenth transistors with the junction between said seventh and eighth diodes connected to the commonly connected collectors of said fifth and sixth transistors, a sixteenth and seventeenth transistor, the bases of said sixteenth and seventeenth transistors respectively connected to the anode of said second diode and the cathode of said first diode, the emitters of said sixteenth and seventeenth transistors respectively connected to the bases of said fourteenth and fifteenth transistors, a ninth diode connected between said first bias terminal and the collector of said sixteenth transistor, a tenth diode connected between said second bias terminal and the collector of said seventeenth transistor, eighteenth and nineteenth transistors, the bases of said eighteenth and nineteenth transistors respectively connected to the collectors of said sixteenth and seventeenth transistors, the emitters of said eighteenth and nineteenth transistors respectively connected to said first and second bias terminals, the collectors of said eighteenth and nineteenth transistors respectively connected to the bases of said thirteenth and twelfth transistors, and an eleventh diode connected between the base and emitter of said eleventh transistor.

21. The operational amplifier of claim 20 wherein said compound emitter follower stage includes a twentieth and twenty-first transistor, the bases of said seventeenth and twenty-first transistor commonly connected to the junction of said fourth and fifth diodes, the emitter of said twentieth transistor connected to said first bias terminal by a ninth current source, the emitter of said twenty-first transistor connected to said second bias terminal by a tenth current source, said compound emitter follower stage further including a twenty-second and twenty-third transistor, the bases of said twenty-second and twenty-third transistors respectively connected to said emitters of said twentieth and twenty-first transistors, the collectors of said twenty-second and twenty-third transistors respectively connected to said first and second bias terminals, and a resistive coupling network for respectively connecting the collectors of said twentieth and twenty-first transistors and the emitters of said twenty-second and twenty-third transistors to the input of said output stage.

22. A push-pull amplifier circuit comprising:

input signal means having input terminal means connected thereto for supplying input current signals to said input signal means, said input signal means including means for performing impedance transformation of said input current signals such that the input terminal means appears loaded by a low impedance, said transformation extending to zero frequency or DC;

bias means coupled to said input signal means for generating a quiescent current;

output means provided by said input signal means for supplying said input current signals in a noninverted condition from a high impedance source of said input signal means, said high impedance source being derived from said impedance transformation means;

output signal inverting means connected to said output means of said input signal means for receiving output signals from said input signal means, said output signal inverting means providing signal gain for amplifying said input current signals to provide amplified output current signals and also receiving said quiescent current from said input signal means for determining the quiescent operating point of said output signal means; and output terminal means connected to said output signal inverting means for receiving said amplified output current signals therefrom.

23. An amplifier circuit according to claim 22 wherein said input signal means comprises complementary transistor means having emitter means thereof connected together and said input terminal means connected to said emitter means.

24. An amplifier circuit according to claim 23 wherein said bias means define other complementary transistor means having base means connected to base means of said first-mentioned complementary transistor means defining idling current set diodes.

25. An amplifier circuit according to claim 22 wherein said output signal inverting means comprises complementary transistor means having collector means thereof connected together and said output terminal means connected to said collector means.

* * * * *